US009073745B2

(12) United States Patent
Liu

(10) Patent No.: US 9,073,745 B2
(45) Date of Patent: Jul. 7, 2015

(54) MEMS PRESSURE SENSOR AND MANUFACTURING METHOD THEREFOR

(75) Inventor: Lianjun Liu, Tianjin (CN)

(73) Assignee: MEMSEN ELECTRONICS INC (CN)

( * ) Notice: Subject to any disclaimer, the term of this patent is extended or adjusted under 35 U.S.C. 154(b) by 0 days.

(21) Appl. No.: 14/004,816

(22) PCT Filed: Feb. 23, 2012

(86) PCT No.: PCT/CN2012/071493
§ 371 (c)(1),
(2), (4) Date: Sep. 12, 2013

(87) PCT Pub. No.: WO2012/122877
PCT Pub. Date: Sep. 20, 2012

(65) Prior Publication Data
US 2014/0001579 A1    Jan. 2, 2014

(30) Foreign Application Priority Data
Mar. 15, 2011   (CN) .......................... 2011 1 0061167

(51) Int. Cl.
B81B 3/00     (2006.01)
B81C 1/00     (2006.01)
G01L 9/00     (2006.01)

(52) U.S. Cl.
CPC ............ *B81B 3/0018* (2013.01); *G01L 9/0073* (2013.01); *B81C 1/00158* (2013.01); *B81C 1/00182* (2013.01); *B81B 2201/0264* (2013.01)

(58) Field of Classification Search
CPC .............................. H01L 21/50; H01L 21/78
USPC .................. 257/415, 419, 48, 416, E21.599; 438/51, 53, 107, 113
See application file for complete search history.

(56) References Cited

U.S. PATENT DOCUMENTS 5,731,520 A *   3/1998   Stevenson et al. .......... 73/514.32
7,560,788 B2 *  7/2009   Fortin et al. .................. 257/415
(Continued)

FOREIGN PATENT DOCUMENTS

CN    1172547 A    2/1998
CN    1297144 A    5/2001
(Continued)

OTHER PUBLICATIONS

International Search Report for International Application No. PCT/CN2012/071493; Mailing Date: May 3, 2012, with English Translation.

*Primary Examiner* — Fernando L Toledo
*Assistant Examiner* — Adam S Bowen
(74) *Attorney, Agent, or Firm* — Cantor Colburn LLP

(57) ABSTRACT

A Micro Electromechanical System (MEMS) pressure sensor may include a first substrate provided with a sensitive diaphragm of a capacitive pressure sensing unit, an electrical connecting layer and a first bonding layer on a surface of the first substrate; and a second substrate provided with an inter-conductor dielectric layer, a conductor connecting layer in the inter-conductor dielectric layer and/or a second bonding layer on a surface of the second substrate. The second substrate is arranged opposite to the first substrate, and the second substrate is fixedly coupled to the first substrate via the first bonding layer and the second bonding layer; a pattern of the first bonding layer is corresponding to a pattern of the second bonding layer, and both the first bonding layer and the second bonding layer are formed of a conductive material.

21 Claims, 6 Drawing Sheets

(56) References Cited

U.S. PATENT DOCUMENTS

| | | |
|---|---|---|
| 8,216,882 B2 * | 7/2012 | Lin et al. ............... 438/113 |
| 2006/0063354 A1 | 3/2006 | Fortin et al. |
| 2008/0053236 A1 * | 3/2008 | Gogoi et al. ............ 73/718 |
| 2008/0217708 A1 * | 9/2008 | Reisner et al. .......... 257/416 |
| 2011/0154905 A1 * | 6/2011 | Hsu et al. ............... 73/724 |
| 2013/0001550 A1 * | 1/2013 | Seeger et al. ........... 257/48 |
| 2013/0001710 A1 * | 1/2013 | Daneman et al. ........ 257/415 |
| 2013/0221457 A1 * | 8/2013 | Conti et al. ............. 257/416 |

FOREIGN PATENT DOCUMENTS

| | | |
|---|---|---|
| CN | 101248340 A | 8/2008 |
| CN | 101941669 A | 1/2011 |
| CN | 102062662 A | 5/2011 |
| CN | 102183335 A | 9/2011 |
| WO | 2010066494 A2 | 6/2010 |

\* cited by examiner

MEMS PRESSURE SENSOR AND MANUFACTURING METHOD THEREFOR

This is the US national stage of application No. PCT/CN2012/071493 filed on Feb. 23, 2012. Priority under 35 U.S.C. §119(a) and 35 U.S.C. §365(b) is claimed from Chinese Application No. 201110061167.5, filed on Mar. 15, 2011, the disclosure of which is incorporated herein by reference in its entirety.

FIELD OF THE INVENTION

The present invention relates to the technical field of Micro Electromechanical System (MEMS), particularly to a MEMS pressure sensor and a manufacturing method thereof.

BACKGROUND OF THE INVENTION

MEMS is a micro electromechanical system which integrates a micro sensor, an executer and a signal processing and controlling circuit, an interface circuit, communication and a power supply as a whole. In recent years, the traditional mechanical quantity sensor is progressively replaced by the MEMS pressure sensor in the fields of automotive electronics, consumer electronics and industry electronics, and has broad market prospects. For example, each of a tire pressure monitoring pressure sensor, an engine oil pressure sensor, an automotive braking system air pressure sensor and an automotive engine intake manifold pressure sensor widely adopts the MEMS technology.

As compared to the traditional mechanical sensor, the MEMS pressure sensor has a smaller size, a higher control precision and a manufacturing technical compatible with the silicon integrated circuit (IC) technology. Therefore, the performance/cost ratio of the MEMS pressure sensor is greatly improved. At present, the MEMS pressure sensor includes a piezoresistance type pressure sensor and a capacitive type pressure sensor, either of them is a MEMS sensor manufactured on a silicon chip.

The capacitive pressure sensor has a film plate capacitor structure which takes the air as the isolation dielectric. When a film electrode of the plate capacitor is deformed by external pressure and thus its capacitance is changed, a capacitance value is converted to a voltage signal via a signal processing circuit, and then the voltage signal is amplified and output. Therefore, the capacitive pressure sensor has a higher measuring precision and lower power consumption.

In the prior art, the capacitive pressure sensor is manufactured through the method of polycrystalline silicon deposition and oxide layer etching. An polycrystalline silicon film after being released is taken as a sensitive diaphragm in this method. The sensitive diaphragm is deformed under an external pressure to cause a change of the capacitance.

However the problem is that, in the manufacturing method of the above traditional capacitive pressure sensor, a pressure sensor chip and a signal processing circuit chip are discrete chips, and integrated by a packaging process after respectively manufactured. Either of a plastic packaging with a cavity and a cover, or a metal-can packaging has a complicated packaging process, and is not easily compatible with a mature IC manufacturing technology. Further more, the sensor has a larger size and a higher cost.

In addition, the sensitive diaphragm of the traditional capacitive pressure sensor is usually on the uppermost surface of a chip, and is vulnerable to be damaged in case of silicon substrate thinning and the chip packaging, thus the production yield is impacted. Furthermore, the pressure sensor chip and the signal processing circuit chip need to be respectively covered by protective gel to protect them from external environmental influence, resulting in higher cost of the capacitive pressure sensor.

SUMMARY OF THE INVENTION

The object of the present invention is to provide a MEMS pressure sensor and a manufacturing method thereof, which can be compatible with the IC manufacturing process, effectively reduce the manufacturing cost and decrease the size of the sensor.

To solve the above problems, a MEMS pressure sensor is provided according to the present invention, and the MEMS pressure sensor includes:

a first substrate provided with a sensitive diaphragm of a capacitive pressure sensing unit, an electrical connecting layer and a first bonding layer on a surface of the first substrate; and a second substrate provided with an inter-conductor dielectric layer, a conductor connecting layer in the inter-conductor dielectric layer and/or a second bonding layer on a surface of the second substrate;

wherein the second substrate is arranged opposite to the first substrate, and the second substrate is fixedly coupled to the first substrate via the first bonding layer and the second bonding layer; a pattern of the first bonding layer is corresponding to a pattern of the second bonding layer, and both the first bonding layer and the second bonding layer are formed of a conductive material.

The capacitive pressure sensing unit may include the sensitive diaphragm, a reference pressure cavity and a fixed electrode, the reference pressure cavity may be disposed between the sensitive diaphragm and the second substrate, and the fixed electrode may be in the reference pressure cavity;

the back surface of the first substrate may be provided with an opening through which the sensitive diaphragm is exposed to the atmosphere.

The sensitive diaphragm may be provided with a protective dielectric layer.

The first bonding layer and/or the second bonding layer may be a Si layer, a Ge layer, an Au layer, an Al layer, an Au/Sn laminated layer or an Al/Ge laminated layer.

The fixed electrode may be on the surface of the second substrate and may be disposed corresponding to the position of the sensitive diaphragm.

In some embodiments, the first substrate may include a silicon substrate, a first dielectric layer on the silicon substrate, a second dielectric layer on the first dielectric layer, a first conductor layer embedded in the second dielectric layer and a second conductor layer on the second dielectric layer;

the first bonding layer may be disposed on the second conductor layer;

the capacitive pressure sensing unit may further include a movable electrode in the reference pressure cavity, which is formed in the second conductor layer and is coupled to the center of the sensitive diaphragm though a supporting arm; and the sensitive diaphragm may be formed in the first conductor layer.

The fixed electrode is on the surface of the first substrate and is corresponding to the position of the sensitive diaphragm.

In some other embodiments, the first substrate may include a silicon substrate, a first dielectric layer on the silicon substrate, a second dielectric layer on the first dielectric layer, a conductor layer embedded in the second dielectric layer and a second conductor layer on the second dielectric layer;

the first bonding layer may be on the second conductor layer;

the sensitive diaphragm may be formed in the first conductor layer; and the fixed electrode may be formed in the second conductor layer and may be coupled to the part of the first conductor layer outside of the sensitive diaphragm though a supporting arm.

The surface of the second substrate within the reference pressure cavity may be provided with a self-test electrode which is disposed corresponding to the sensitive diaphragm of the capacitive pressure sensing unit in the first substrate.

The supporting arm may be a part of the second conductor layer or the second dielectric layer.

The second substrate may include a SOI substrate or a monocrystalline silicon substrate, and a signal processing circuit may be further provided in the part of the second substrate below the inter-conductor dielectric layer.

The second substrate may be further provided with a plurality of wire-bonding pads on the periphery of the conductor connecting layer, and the part of the first substrate corresponding to the plurality of wire-bonding pads may be removed.

The MEMS pressure sensor may further include a reference unit which has the same structure as the capacitive pressure sensing unit.

In some embodiments related to a packaging structure, the MEMS pressure sensor may further include:

a packaging substrate which is below the second substrate and provided with a plurality of wire-bonding pins;

a packaging body which is above the packaging substrate and encloses the first substrate and the second substrate;

an adhesive which is disposed between the second substrate and the packaging substrate; and a lead which is in the packaging body, two ends of the lead are respectively coupled to the wire-bonding pad and the wire-bonding pin.

A stress buffer layer may be provided between the packaging body and the first substrate and the second substrate which are fixedly coupled to each other.

Accordingly, a manufacturing method for a MEMS pressure sensor according to the present invention includes:

providing a first substrate, and forming, in the first substrate, a capacitive pressure sensing unit, an electrical connecting layer and a first bonding layer on a surface of the first substrate;

providing a second substrate, and forming, in the second substrate, an inter-conductor dielectric layer, a conductor connecting layer in the inter-conductor dielectric layer and/or a second bonding layer on a surface of the second substrate; and arranging the first bonding layer to be opposite to the second bonding layer, and bonding the first bonding layer to the second bonding layer according to a pattern correspondence so as to fixedly and electrically couple the first substrate to the second substrate.

The step of forming, in the first substrate, the capacitive pressure sensing unit, the electrical connecting layer and the bonding layer on a surface of the first substrate may include:

forming, in the first substrate, a first dielectric layer and a first conductor layer on the first dielectric layer; a through-hole and a connecting plug being provided in the first dielectric layer, and a sensitive diaphragm of the capacitive pressure sensing unit and an electrical connecting layer being provided in the first conductor layer;

depositing a first bonding material layer on the surface of the first substrate in which the sensitive diaphragm and the electrical connecting layer are provided; and etching the first bonding material layer by a photolithography process using a first mask plate so as to form the first bonding layer, a part of the first bonding material layer above the sensitive diaphragm being also removed.

The step of forming, in the second substrate, an inter-conductor dielectric layer, a conductor connecting layer in the inter-conductor dielectric layer and/or a second bonding layer on a surface of the second substrate may include:

forming, in the second substrate, the inter-conductor dielectric layer and the conductor connecting layer in the inter-conductor dielectric layer;

depositing a second bonding material layer on the conductor connecting layer, or the second bonding material layer being the uppermost conductor material layer among the conductor connecting layer; and etching the second bonding material layer by the photolithography process using a second mask plate so as to form the second bonding layer.

The manufacturing method for the MEMS pressure sensor may further include: forming a plurality of wire-bonding pads within a wire-bonding pad area on the periphery of the conductor connecting layer while forming the second bonding layer or the conductor connecting layer in the second substrate.

The manufacturing method for the MEMS pressure sensor, after or before fixedly and electrically coupling the first substrate to the second substrate the manufacturing method may further include: removing a part of the first substrate corresponding to the wire-bonding pad area to expose the plurality of wire-bonding pads at the wire-bonding pad area, and at the same time, removing a part of the first substrate above the sensitive diaphragm.

The arranging the first bonding layer to be opposite to the second bonding layer and bonding the first bonding layer to the second bonding layer according to a pattern correspondence may include:

arranging the first bonding layer of the first substrate to be opposite to the second bonding layer of the second substrate, so that the pattern of the first bonding layer and the pattern of the second bonding layer are in contact with each other; and applying a pressure from the back surfaces of the two substrates, and meanwhile, heating the two substrates, so that the contact surfaces of the first bonding layer and the second bonding layer are coupled together.

The manufacturing method for the MEMS pressure sensor may further include:

forming a self-test electrode while forming the second bonding layer on the second substrate, or forming the self-test electrode while forming the conductor connecting layer in the second substrate, the position of the self-test electrode being corresponding to the sensitive diaphragm of the capacitive pressure sensing unit on the first substrate.

The manufacturing method for the MEMS pressure sensor, after fixedly and electrically coupling the first substrate to the second substrate the manufacturing method may further include:

providing a packaging substrate on which a plurality of wire-bonding pins are provided;

coupling a surface of the second substrate opposite to the first substrate to the packaging substrate;

electrically coupling the wire-bonding pads of the second substrate to the corresponding wire-bonding pad pins on the packaging substrate via a lead; and performing a plastic molding process to fill a space above the surface of the packaging substrate, except for the first substrate and the second substrate, with a packaging body.

The manufacturing method for the MEMS pressure sensor, before performing the plastic molding, may further include:

forming a stress buffer layer between the packaging body and the first substrate and the second substrate which are fixedly coupled to each other.

As compared to the technology in the prior art, the above technical solution has the following advantages:

The MEMS pressure sensor and the manufacturing method thereof according to the embodiments of the present invention include two substrates, one substrate is configured to form the capacitive pressure sensing unit, and the other substrate is configured to form the conductor connecting layer (and the signal processing circuit). The two substrates are face to face bonded together through the first bonding layer and the second bonding layer, and meanwhile, a sealed structure is formed between the two substrates. Then the back surface of the first substrate is etched by the silicon deep reactive etching, and the sensitive diaphragm element of the capacitive pressure sensing unit and the wire-bonding pad area on the second substrate are exposed at the same time. The packaging is performed finally. Therefore, the first substrate and the second substrate may be manufactured separately, and either of the manufacturing processes for the two substrates is compatible with the IC. The two substrates are integrated together though the bonding process, which avoids the complexity of the packaging process, decreases the size of a device and reduces the cost, and has the advantage that process is simple and convenient.

Furthermore, the above method may use the traditional plastic packaging method to effectively reduce the cost and decrease the volume of the sensor.

BRIEF DESCRIPTION OF THE DRAWINGS

The above mentioned and other objects, features and advantages will be apparent from the accompanying drawings in which the like reference numerals designate the same elements. The accompanying figures are not intentionally drawn on a one to one scale according to the actual size and are intended to show the subject matter of the present invention.

DETAILED DESCRIPTION OF THE INVENTION

To make the above objects, features and advantages of the present invention to be more apparent and understood, the embodiments of the present invention will be described in detail in conjunction with the accompanying drawings below.

Many details are described below to make the present invention fully understood, and the present invention may be further implemented in other ways different from the ways described herein. The similar extension may be made by the skilled in the art without departing from the spirit of the present invention. Therefore, the present invention is not limited to the embodiments disclosed below.

Furthermore, the present invention will be described in detail in conjunction with schematic diagrams. When an embodiment of the present invention is described, a sectional view of a structure of a device will not be locally enlarged on a general scale for the purpose of description. The shown schematic diagrams are exemplary and will not limit the protection scope of the present invention. Additionally, a three dimension space size of a length, a width and a depth will be included in the actual manufacturing.

First Embodiment

Figure 1:
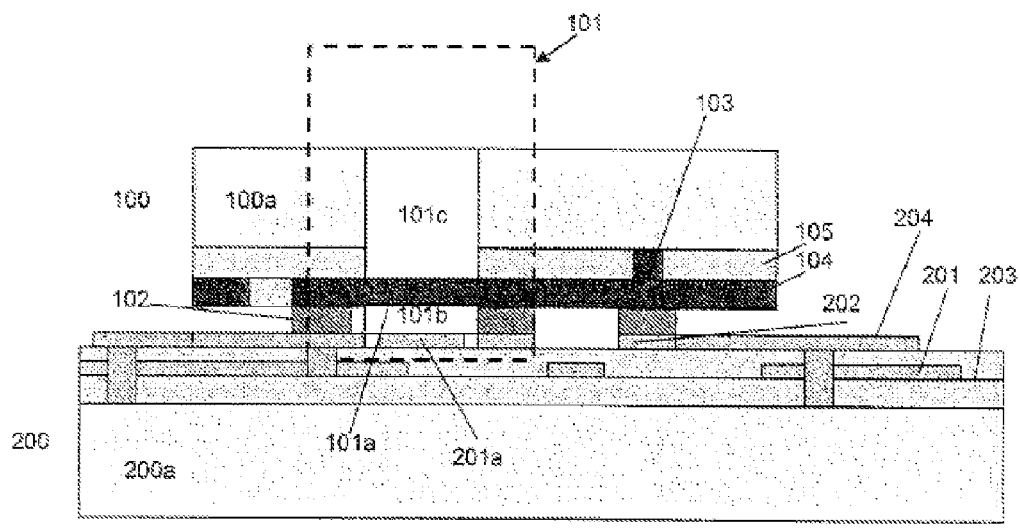
FIG. 1 is a schematic structural diagram of a MEMS pressure sensor according to a first embodiment.

FIG. 1 is a schematic structural diagram of a MEMS pressure sensor according to the present embodiment. As shown, the MEMS pressure sensor includes: a first substrate 100 provided with a sensitive diaphragm 101a of a capacitive pressure sensing unit 101, an electrical connecting layer 103 and a first bonding layer 102 on a surface of the first substrate 100; and a second substrate 200 provided with an inter-conductor dielectric layer 203, a conductor connecting layer 201 in the inter-conductor dielectric layer 203 and a second bonding layer 202 on a surface of the second substrate 200.

The second substrate 200 is arranged opposite to the first substrate 100, both of them are fixedly coupled through the first bonding layer 102 and the second bonding layer 202, which are both formed of a conductive material, and there exists a pattern correspondence between the first bonding layer 102 and the second bonding layer 202. The "pattern correspondence" here means the alignment of the patterns of corresponding positions of the first bonding layer 102 and the second bonding layer 202. The sizes, shapes of the patterns may be different between the two substrates and the positions may be misaligned, as long as the overlapping parts between the patterns can be in contact with each other after the second substrate 200 is arranged opposite to the first substrate 100. It is to be noted that the "above" and "below" for indicating position relationship hereinafter are limited only to the case as shown in FIG. 1 that the first substrate 100 is reversely disposed above the second substrate 200.

The first bonding layer 102 and/or the second bonding layer 202 may be a Si layer, a Ge layer, an Au layer, Al layer, an Au/Sn laminated layer or an Al/Ge laminated layer, and may also be formed of other conductor or alloy materials. Since the first bonding layer 102 and the second bonding layer 202 either of which is formed of a conductive material are in contact with each other and thus electrical connection between the first substrate 100 and the second substrate 200 may be achieved, the capacitive pressure sensing unit 101 in the first substrate 100 may be coupled with the conductor connecting layer in the second substrate 200.

The capacitive pressure sensing unit 101 includes the sensitive diaphragm 101a, a reference pressure cavity 101b and a fixed electrode 201a. In the present embodiment, the first substrate 100 includes a silicon substrate 100a on which a first dielectric layer 105 and a first conductor layer 104 on the first dielectric layer 105 are provided. The second substrate 200 includes a silicon substrate 200a on which the inter-conductor dielectric layer 203 formed by a traditional process and the conductor connecting layer 201 in the inter-conductor dielectric layer 203 are provided.

The sensitive diaphragm 101a is formed by the first conductor layer 104 of the first substrate 100, and the fixed electrode is formed by the conductor connecting layer 201 on a surface of the second substrate. The reference pressure cavity 101b is disposed between the sensitive diaphragm 101a and the second substrate 200. The fixed electrode 201a is located in the reference pressure cavity 101b and is corresponding to the position of the sensitive diaphragm 101a. The back surface of the first substrate 100 is provided with an opening 101c through which the sensitive diaphragm 101a is exposed to the atmosphere. The reference pressure cavity 101b is provided below the sensitive diaphragm 101a (toward the second substrate 200) and between the second substrate 200 and the sensitive diaphragm 101a. Due to the exist of the opening 101c and the reference pressure cavity 101b, the sensitive diaphragm 101a has a degree of freedom to deform in the direction perpendicular to the first substrate 100 and the second substrate 200. The reference pressure cavity 101b and the opening 101c are respectively located on two sides of the sensitive diaphragm 101a, and the reference pressure cavity 101b is sealed relative to the outside so as to provide a fixed reference pressure value with respect to the pressure change of the opening on the other side.

In addition, a protective dielectric layer (not shown) may be further provided on the capacitive pressure sensing unit 101 and the electrical connecting layer 103, which may be configured to prevent the sensitive diaphragm from being damaged in forming the first bonding layer later, and may also server as an etching stop layer for a later process.

The second substrate 200 includes a Silicon-on-insulator (SOI) substrate or monocrystalline silicon substrate 200a. Preferably, the second substrate 200 includes a signal processing circuit (not shown) which is located below the inter-conductor dielectric layer 203 and the conductor connecting layer 201. The signal processing circuit being such as a Complementary Metal Oxide Semiconductor (CMOS) circuit is configured to receive, convert and detect an external pressure signal sensed by the capacitive pressure sensing unit 101, and the conductor connecting layer 201 is configured to couple different devices and couple the second bonding layer 202 and the signal processing circuit in the second substrate 200. The second bonding layer 202 is located above the conductor connecting layer 201, or the second bonding layer 202 is the uppermost conductor layer of the conductor connecting layer 201.

Furthermore, multiple wire-bonding pads 204 are provided on the second substrate 200. The wire-bonding pads 204 may be located at the outside of the conductor connecting layer 201 (and the signal processing circuit) of the second substrate 200 and may be in the same film layer as the second bonding layer 202. The part of the first substrate 100 corresponding to the wire-bonding pads 204 is removed, so that the wire-bonding pads 204 is exposed and coupled with a lead.

In the MEMS pressure sensor according to the present embodiment, the sensitive diaphragm 101a of the capacitive pressure sensing unit is influenced by a change of an external pressure, leading to a change in the distance between the fixed electrode 201a and the sensitive diaphragm 101a. The change in the distance is converted to a change in the capacitance of the capacitive pressure sensing unit, and is output through the conductor connecting layer 201 of the second substrate.

Figure 2:
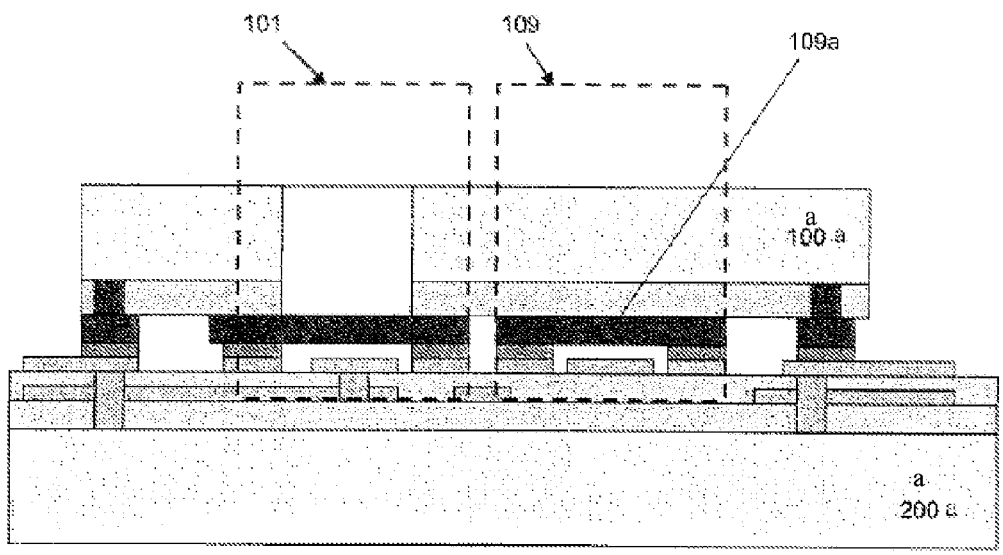
FIG. 2 is a schematic structural diagram of another preferred MEMS pressure sensor according to the first embodiment.

Preferably, the MEMS pressure sensor according to another embodiment of the present invention may further include a reference unit with the same structure as the capacitive pressure sensing unit. As shown in FIG. 2, the capacitive pressure sensing unit 101 and the reference unit 109 constitute a differential sensor. Either of the capacitive pressure sensing unit 101 and the reference unit 109 is formed by oppositely coupling the first substrate 100 and the second substrate 200 and has the same structure as each other. However, no opening is provided in the first substrate above a sensitive diaphragm 109a of the reference unit. By measuring the capacitance of the capacitive pressure sensing unit and the capacitance of the reference unit at the same time and calculating the difference between the two capacitances as a differential output, the influence of the external environmental factors (e.g., temperature, stress) on the output of the sensor may be reduced.

Figure 3:
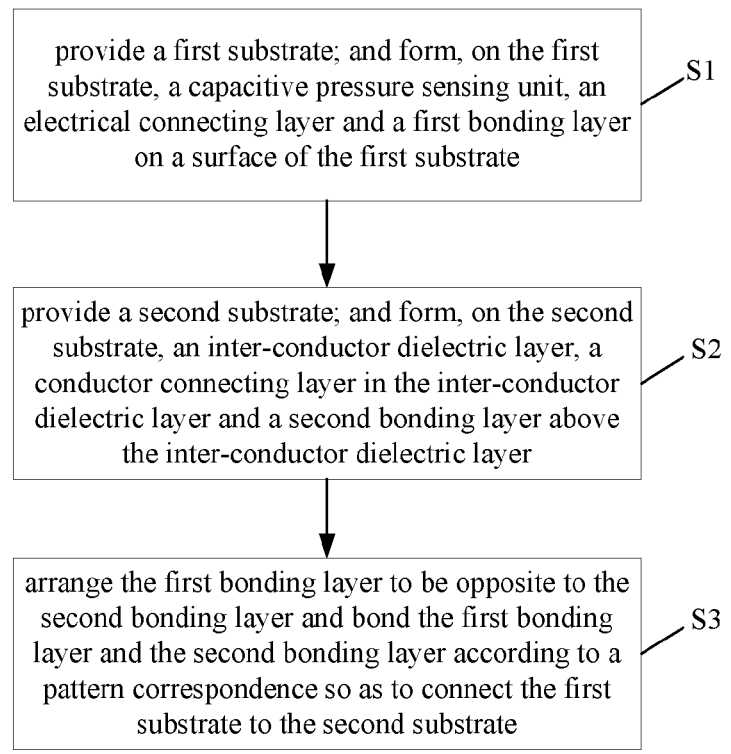
FIG. 3 is a flowchart of a manufacturing method for the MEMS pressure sensor according to the first embodiment.
Figure 4:
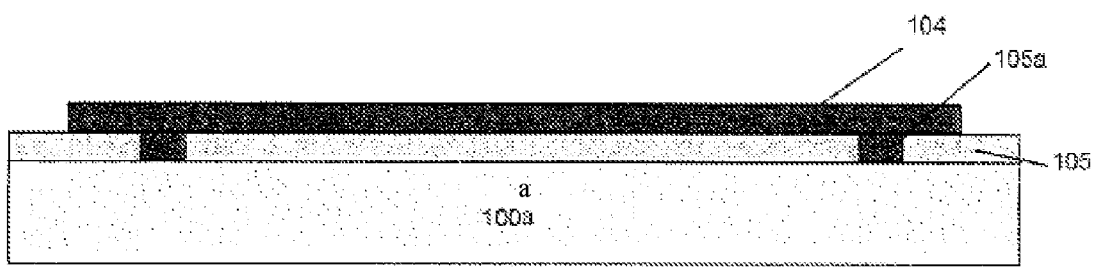
FIGS. 4 to 8 are schematic diagrams of the manufacturing method for the MEMS pressure sensor according to the first embodiment.
Figure 5:
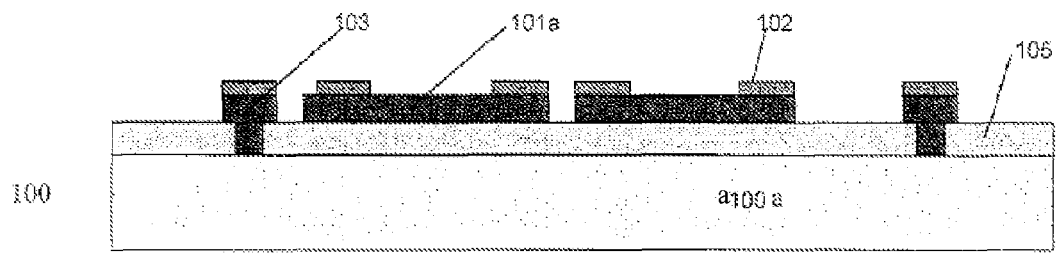

The manufacturing method for the MEMS pressure sensor will be described in detail in conjunction with the accompanying drawings. FIG. 3 is a flowchart of a manufacturing method for the MEMS pressure sensor according to the embodiment, and FIGS. 4 to 8 are schematic diagrams of the manufacturing method for the MEMS pressure sensor. As shown, the manufacturing method includes:

Step S1: a first substrate 100 is provided. As shown in FIGS. 4 and 5, the first substrate 100 is provided with a capacitive pressure sensing unit 101, an electrical connecting layer 103 and a first bonding layer 102 on a surface of the first substrate 100.

As shown in FIG. 4, the first substrate 100 includes a silicon substrate 100a on which a first dielectric layer 105 is provided. Preferably, the first dielectric layer 105 is a silicon oxide film layer. A through-hole 105a is provided in the first dielectric layer 105 by performing photolithography and etching on the silicon oxide film layer, and then a first conductor layer 104 is deposited on the first dielectric layer 105. Preferably, the first conductor layer 104 is formed of polycrystalline silicon, and the polycrystalline silicon is deposited into the through-hole 105a to form a connecting plug so as to couple a component in a layer above the first dielectric layer 105 to a component in a layer below the first dielectric layer 105

Next, as shown in FIG. 5, a sensitive diaphragm 101a of the capacitive pressure sensing unit and the electrical connecting layer 103 are formed in the first conductor layer 104 by the photolithography and etching process.

A first bonding material layer (not shown) is deposited on the surface of the first substrate 100 in which the sensitive diaphragm 101a and the electrical connecting layer 103 are provided. The first bonding material layer is etched through the photolithography and etching process by using a first mask plate so as to form the first bonding layer 102. The part of the first bonding material layer above the sensitive diaphragm 101a is also removed. The etching process in this step may be a traditional wet etching or plasma etching. Thus, the manufacturing of the first substrate 100 is accomplished.

Preferably, a protective dielectric layer (not shown) may be further formed on the capacitive pressure sensing unit 101 and the electrical connecting layer 103.

Figure 6:
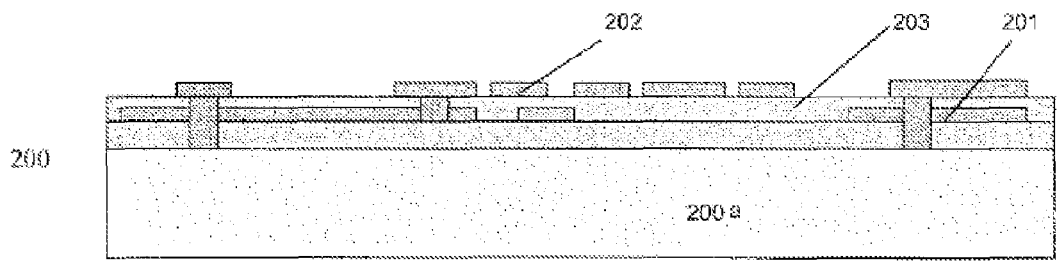

Step S2: a second substrate 200 is provided. As shown in FIG. 6, the second substrate 200 is provided with an inter-conductor dielectric layer 203, a conductor connecting layer 201 in the inter-conductor dielectric layer 203 and a second bonding layer 202 above the inter-conductor dielectric layer 203.

The second substrate 200 includes a SOI substrate or a monocrystalline silicon substrate 200a. Preferably, a signal processing circuit is formed in the second substrate 200 by a traditional process; for example, the signal processing circuit includes a CMOS circuit. Then the inter-conductor dielectric layer 203 on the signal processing circuit and the conductor connecting layer 201 in the inter-conductor dielectric layer 203 are formed. A copper interconnection process or an aluminum interconnection process may be adopted in this step.

Next, a second bonding material layer (not shown) is deposited on the inter-conductor dielectric layer 203. Etching the second bonding material layer by the photolithography process using a second mask plate so as to form a second bonding layer 202. The second bonding layer 202 may be electrically coupled to the conductor connecting 201 below the second bonding layer 202 through a through-hole and a connecting plug in the inter-conductor dielectric layer 203.

Both the first bonding layer 102 and the second bonding layer 202 are formed of a conductive material, for example, the first bonding layer 102 and/or the second bonding layer 202 is an Au layer, an Al layer, an Au/Sn laminated layer or an Al/Ge laminated layer. When the first bonding layer 102 and/or the second bonding layer 202 is the Au/Sn laminated layer, a pattern of the first bonding layer 102 and/or the second bonding layer 202 is formed by the an electroplating process, and when the first bonding layer 102 and/or the second bonding layer 202 is the Al/Ge laminated layer, the pattern of the first bonding layer 102 and/or the second bonding layer 202 is formed by a photolithography and etching process.

Preferably, the bonding layer 202 is formed of the same material (e.g., Al) as the conductor connecting layer 201, and the second bonding layer 202 is the uppermost conductor layer of the conductor connecting layer. In other words, the pattern of the second bonding layer 202 is formed during the process of manufacturing the uppermost conductor layer of the conductor connecting layer, thus a photolithography process can be omitted and the cost can be reduce.

After the photolithography and etching process, there exists a correspondence between the patterns of the first bonding layer 102 and the second bonding layer 202. The "correspondence" here means that: when the first substrate 100 and the second substrate 200 are arranged opposite to each other, the first bonding layer 102 is toward the second bonding layer 202, and the positions and shapes of the patterns of the first bonding layer 102 and the second bonding layer 202 align to each other and can be coupled correspondingly.

When the second bonding layer 202 or the conductor connecting layer 201 is formed, multiple wire-bonding pads 204 of a wire-bonding pad area are formed on an outside area of the substrate 200 in the conductor connecting layer 201 and the second bonding layer 202.

Specifically, the conductor connecting layer 201 (and the signal processing circuit) is in a device area of the second substrate 200, the area of the second substrate 200 outside the device area includes the wire-bonding pad area which includes multiple wire-bonding pads 204 for coupling to the wire-bonding leads. In addition, the area of the second substrate 200 outside the device area further includes a chip dicing area.

Figure 7:
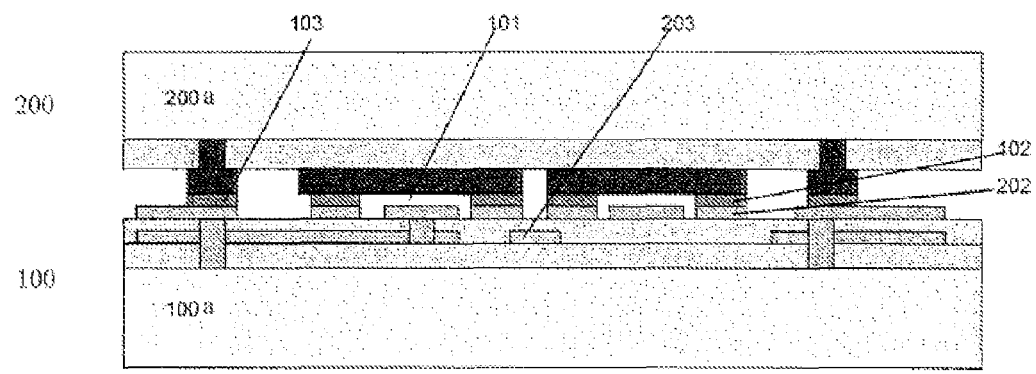

Step S3: the first bonding layer 102 is arranged opposite to the second bonding layer 202, and the first bonding layer 102 is bonded to the second bonding layer 202 according to the correspondence between their patterns so as to couple the first substrate 100 to the second substrate 200, as shown in FIG. 7.

Specifically, the first bonding layer 102 of the first substrate 100 and the second bonding layer 202 of the second substrate 200 are arranged opposite to each other, so that the patterns of the first bonding layer 102 of the first substrate 100 and the second bonding layer 202 of the second substrate 200 are in contact with each other. Then a pressure is forced on the back surfaces of the two substrates, and meanwhile, heating is performed to make the contact surfaces between the first bonding layer 102 and the second bonding layer 202 coupled together. For example, in the case where the first bonding layer 102 and the second bonding layer 202 are Al layers, a pressure of 40 kN to 90 kN is forced on the substrates via a suction cup on the back surfaces of the substrates. Then the substrates is heated to a temperature of 400° C., so that the Al layers in contact with each other are bonded in a solid state and fixedly coupled after the temperature is lowered. Process parameters of the above coupling process vary based on different materials of the first bonding layer 102 and the second bonding layer 202.

Both the first bonding layer 102 and the second bonding layer 202 are formed of a conductive material, such as a conductor or an alloy. When the first bonding layer 102 is fixedly coupled to the second bonding layer 202, the capacitive pressure sensing unit 101 and the electrical connecting layer 103 of the first substrate 100 can be electrically coupled to the conductor connecting layer 203 (and the signal processing circuit) of the second substrate 200, such that the capacitive pressure sensing unit 101 is integrated with the conductor connecting layer 203 (and the signal processing circuit).

Figure 8:
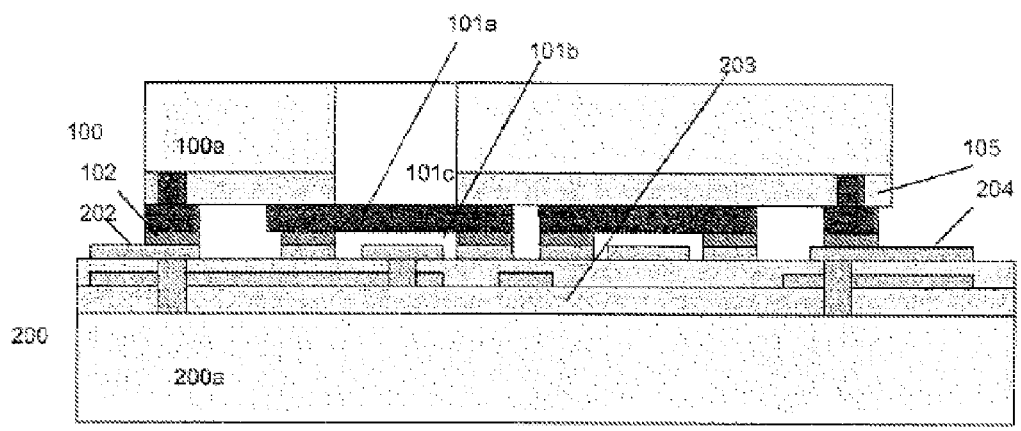

Preferably, as shown in FIG. 8, a step S4: after the first substrate 100 and the second substrate 200 being coupled, further includes: removing a part of the first substrate 100 corresponding to the wire-bonding pad area by an etching process so as to expose the multiple wire-bonding pads 204 in the wire-bonding pad area, and meanwhile, removing the silicon substrate 100 and the silicon oxide layer 105 on the back of the sensitive diaphragm 101a, the etching being stopped at the back surface of the sensitive diaphragm 101a. For example, firstly a masking layer (not shown) is formed on the back surface of first substrate 100, and the masking layer exposes an opening and a part of the back surface of the first substrate 100 corresponding to the wire-bonding pad area. The silicon substrate 100 and the silicon oxide layer 105 are etched from the surface of the first substrate 100 by using a first etching gas. When most of the material of the silicon oxide layer 105 is removed, the etching for the position of the opening is close to the back surface of the sensitive diaphragm, and the remaining part of the silicon oxide layer 105 on the first substrate 100 corresponding to the wire-bonding pad area is relatively thin. Then, the etching is continued by using a second etching gas (which has a relatively high silicon etching selectivity) until the silicon oxide layer 105 is completely removed to expose the opening, and the part of the first substrate corresponding to the wire-bonding pad area is completely removed.

Furthermore, the above step may be performed only on the first substrate 100 before the pattern of the first bonding layer 102 of the first substrate 100 become in contact with the pattern of the second bonding layer 202 of the second substrate 200, so as to prevent the second substrate 200 from being polluted by the etching process.

For removing the part of the first substrate 100 corresponding to the sensitive diaphragm 101a of the capacitive pressure sensing unit 101, the silicon substrate 100a and the silicon oxide layer 105 may be removed sequentially and only the sensitive diaphragm 101a is kept. The etching may also be stopped on the surface of silicon oxide layer 105 and only the silicon substrate 100a is removed such that the silicon oxide layer 105 may function to protect the sensitive diaphragm. The part of the silicon oxide layer 105 on the first substrate corresponding to the wire-bonding pad area needs to be removed in advance in this solution in the step S1 of manufacturing the first substrate.

After the sensitive diaphragm 101a and the first bonding layer 102 of the first substrate, and the inter-conductor dielectric layer 203 and the second bonding layer 202 of the second substrate are bonded and coupled, a reference pressure cavity 101b is formed at a position corresponding to the opening 101c.

In another embodiment according to the present invention, the order in which the step S1 and the step S2 are executed is exchangeable. The step S1 and the step S2 may also be executed simultaneously and the order can be neglected. In practice, the manufacturing processes of the first substrate and the second substrate may be respectively performed by different machines so as to improve the productivity.

So far, the manufacturing for a chip of the MEMS pressure sensor according to the present embodiment has been done. An array of multiple MEMS pressure sensors is formed on the first substrate 100 and a conductor connecting array (not shown) corresponding to the multiple MEMS pressure sensor chips is formed on the second substrate 200. Next, a dicing process is performed, and hereafter, the manufacturing of the MEMS pressure sensor is switched from the silicon chip manufacturing process to a chip packaging process which is compatible with the chip packaging process for the IC and suitable for mass manufacturing so as to facilitate to improve the productivity. The packaging process according to this embodiment is substantially the same as the following embodiment, and reference may be made to the explanation of a third embodiment.

The MEMS pressure sensor and the manufacturing method thereof according to an embodiment of the present invention include two substrates. The first substrate is configured to form the sensitive diaphragm of the capacitive pressure sensing unit, and the second substrate is configured to form the fixed electrode and the conductor connecting layer (and the signal processing circuit). The two substrates are coupled face to face through the first bonding layer and the second bonding layer, and meanwhile a sealed structure is formed between the two substrates. Then the back surface of the first substrate is etched using a silicon deep reactive etching, and meanwhile, the sensitive diaphragm of the capacitive pressure sensing unit and the wire-bonding pad area on the second substrate are exposed and then the packaging is performed. Thus, the first substrate and the second substrate may be manufactured separately. Either of the manufactures of the first substrate and the second substrate is compatible with an IC, and the first substrate and the second substrate are integrated by a bonding process. Therefore, the complexity of the packaging process integration is avoided; and it facilitates to reduce the size of a device and decrease the cost and has the advantage that the process is simple and convenient.

Second Embodiment

A main difference between the MEMS pressure sensor according to the second embodiment and that according to the first embodiment is that: in this embodiment, the fixed electrode and the sensitive diaphragm of the MEMS pressure sensor are both on the surface of the first substrate, and the position of the reference pressure cavity formed between the first substrate and the second substrate is corresponding to the position of the sensitive diaphragm.

Figure 9:
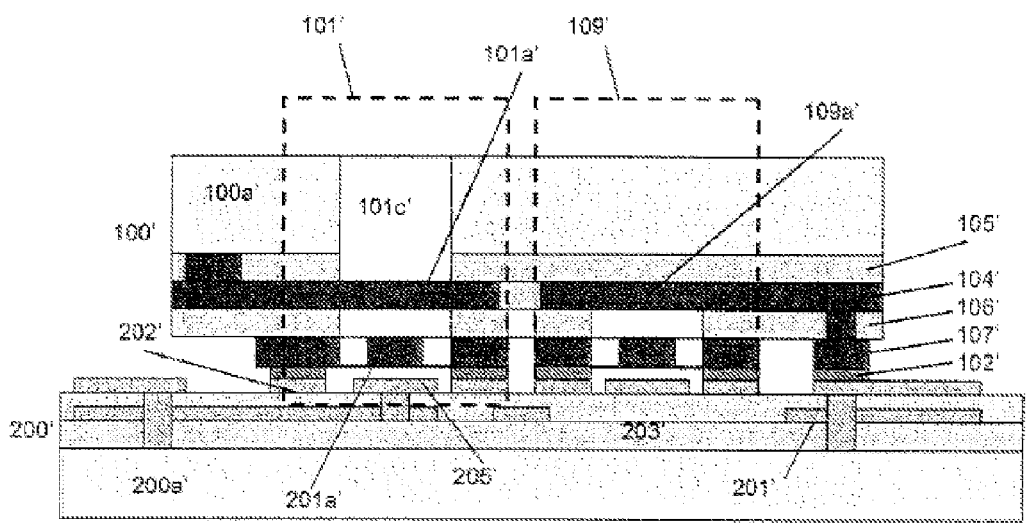
FIG. 9 is a schematic structural diagram of a MEMS pressure sensor according to a second embodiment.

FIG. 9 is a schematic structural diagram of the MEMS pressure sensor according to the present embodiment. As shown in this Figure, A first substrate 100' sequentially includes a silicon substrate 100a', a first dielectric layer 105' on the silicon substrate 100a', a second dielectric layer 106' on the first dielectric layer 105', a first conductor layer 104' embedded in the second dielectric layer 106' and a second conductor layer 107' on the second dielectric layer 106'.

A sensitive diaphragm 101a' is formed in the first conductor layer 104' and a part of the silicon 100a' corresponding to the sensitive diaphragm 101a' is provided with an opening 101c', and a fixed electrode 201a' is formed in the second conductor layer 107' and is coupled to a part of the first conductor 104' outside the sensitive diaphragm through a supporting arm (not shown). A first bonding layer 102' is above the second conductor layer 107'.

A second substrate 200' includes a SOI substrate or monocrystalline silicon substrate 200a', an inter-conductor dielectric layer 203' above the second substrate, a conductor connecting layer 201' in the inter-conductor dielectric layer 203' and a second bonding layer 202' on a surface of the conductor connecting layer 201'.

Preferably, a signal processing circuit (not shown) is provided in the second substrate 200' and is below the inter-conductor dielectric layer 203' and the conductor connecting layer 201'. The signal processing circuit (e.g., a CMOS circuit) is configured to receive, convert and detect an external pressure signal sensed by the capacitive pressure sensing unit 101'. The conductor connecting layer 201' is configured to couple different devices and couple the second boding layer 202' and the signal processing circuit in the second substrate 200'.

In the present embodiment, the second bonding layer 202' is formed above the conductor connecting layer 201'. In other embodiments of the present invention, the second bonding layer 202' is the uppermost conductor layer of the conductor connecting layer. In other words, in a process of manufacturing the uppermost conductor layer of the conductor connecting layer, a pattern of the second bonding layer is manufactured, so as to reduce photolithography process and facilitate to reduce the cost.

Patterns of the first bonding layer 102' and the second bonding layer 202' are corresponding to and fixedly coupled to each other. Both the first bonding layer 102' and the second bonding layer 202' are formed of a conductive material and thus an electrical connection between the first substrate 100' and the second substrate 200' is achieved. Therefore, the capacitive pressure sensing unit 101' in the first substrate 100' is coupled with the conductor connecting layer 201' in the second substrate 200'.

After the patterns of the first bonding layer 102' and the second bonding layer 202' are corresponding to and fixedly coupled to each other, a reference pressure cavity 101b' is formed between the first substrate 100' and the second substrate 200'. As shown in FIG. 8, the reference pressure cavity 101b' is formed by the sensitive diaphragm 101a', the first bonding layer 102' of the second conductor layer 107' of the first substrate, and the conductor connecting layer 201' and the second bonding layer 202' of the second substrate. The position of the reference pressure cavity 101b' is corresponding to that of the opening 101c'.

In the present embodiment, one end of a fixed electrode 201a' is fixedly coupled to the first conductor layer (or the second dielectric layer). The sensitive diaphragm 101a' is formed in the first conductor layer 104' and is exposed to the outside through the opening 101c'. When an change in the external pressure causes the sensitive diaphragm 101a' to move, the distance between the sensitive diaphragm 101a' and the fixed electrode 201a' is changed, so that a change in the capacitance of the capacitive pressure sensing unit 101' is induced, and is output through the conductor connecting layer 201' of the second substrate.

The supporting arm is a part of the second conductor layer 107' or the second dielectric layer 106'. Specifically, the supporting arm may be a normal cantilever structure in the MEMS device.

Preferably, a surface of the second substrate 200' in the reference pressure cavity 101b' is provided with a self-test electrode 205' which is separated from the fixed electrode 201a' at a distance. The self-test electrode 205' is aligned with the fixed electrode 201a' on the surface of the first substrate 100', and also coupled to the conductor connecting layer 201'. When a test voltage is applied between the self-test electrode 205' and the sensitive diaphragm 101a', a self-test function of the capacitive pressure sensing unit may be achieved. Other structures of the MEMS pressure sensor according to the present embodiment are the same as that of the first embodiment and thus omitted.

Similarly to the above embodiment, the MEMS pressure sensor according to the present embodiment may further include a reference unit which has the same structure as the capacitive pressure sensing unit. As shown in FIG. 9, the capacitive pressure sensing unit 101' and the reference unit 109' constitute a differential sensor, and both of them are formed by oppositely coupling the first substrate 100' and the second substrate 200', and have the same structure. However, no opening is provided in the part of the first substrate above the sensitive diaphragm 109a' of the reference unit. By measuring the capacitances of the capacitive pressure sensing unit and the reference unit simultaneously, and calculating a difference between the capacitances as a differential output, the influence of the external environmental factors (temperature, stress etc.) on the output of the sensor may be reduced.

The manufacturing method for the MEMS pressure sensor of the present embodiment is different from that of the first embodiment mainly in that: according to the this embodiment, in the manufacturing process of the first substrate, a second dielectric layer and a second conductor layer need to be formed, and the supporting arm and the fixed electrode are formed by structure releasing. The manufacturing method will be illustrated in conjunction with FIGS. 10 to 12.

Figure 10:
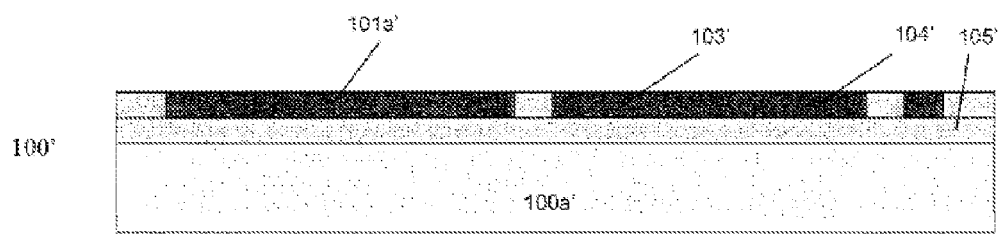
FIGS. 10 to 12 are schematic diagrams of a manufacturing method for the MEMS pressure sensor according to the second embodiment.

Step S1': as shown in FIG. 10, a first substrate 100' is provided, which includes a silicon substrate 100a', the first substrate 100' is provided with a first dielectric layer 105' and a through-hole (not labeled) is provided in the first dielectric layer 105', then a first conductor layer 104' is deposited. Next, a sensitive diaphragm 101a' and an electrical connecting layer 103' are formed in the first conductor 104' by a photolithography and etching process.

Figure 11:
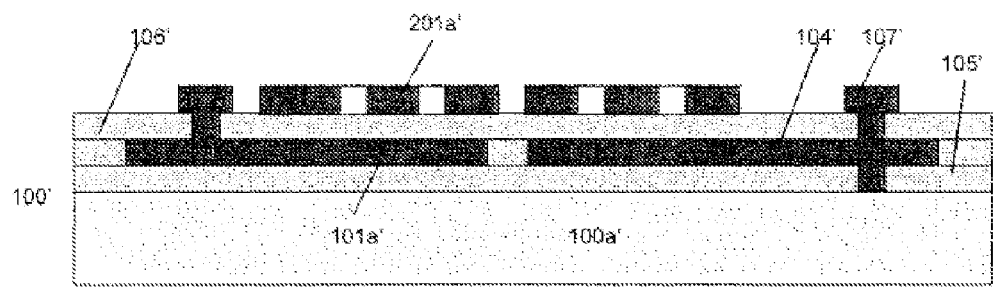

Step S2': as shown in FIG. 11, a second dielectric layer 106' is deposited on the surface of the first conductor layer 104'. Preferably, the second dielectric layer 106' is a silicon oxide film layer. A through-hole is formed in the second dielectric layer 106' by perform photolithography and etching on the silicon oxide film layer, and a second conductor layer 107' is deposited on the second dielectric layer 106'. Preferably, the second conductor layer 107' is formed of polycrystalline silicon. Next, a fixed electrode 201a' of the capacitive pressure sensing unit is formed in the second conductor layer 107' by the photolithography and etching process.

Figure 12:
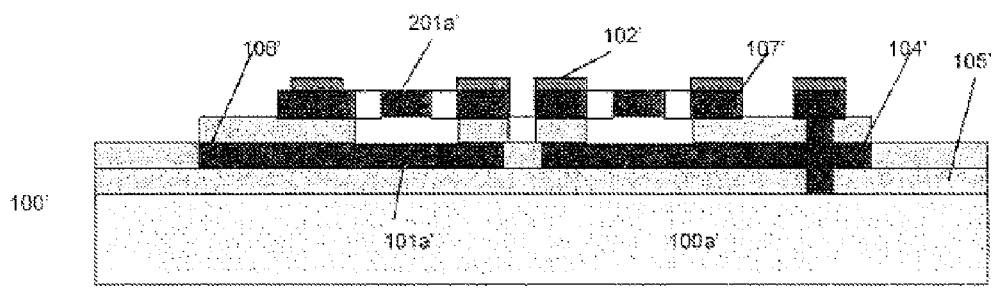

Step S3': as shown in FIG. 12, a first bonding material layer (not shown) is deposited on the second conductor layer 107' and is etched by the photolithography and etching process using a first mask plate so as to form a first bonding layer 102'. A part of the first bonding material layer above the fixed electrode 201a' is also removed. The etching process in this step may be a traditional wet etching or plasma etching process. Finally, a part of the second dielectric layer (as shown in FIG. 12) between the fixed electrode 201a' and the sensitive diaphragm 101a' is removed, and the manufacturing of the first substrate 100' is accomplished.

Preferably, a protective dielectric layer (not shown) is further provided on the capacitive pressure sensing unit 101' and the electrical connecting layer 103'.

The manufacturing process of the second substrate 200', the opening 101c' and the wire-bonding pad are similar to that of the first embodiment, and thus are omitted here.

Step S4': the first bonding layer 102' and the second bonding layer 202' are arranged to be opposite to each other, and are bonded according to the patter correspondence so as to couple the first substrate 100' to the second substrate 200'. After the sensitive diaphragm 101a', the first bonding layer 102' of the first substrate, the inter-conductor dielectric layer 203' and the second bonding layer 202' of the second substrate are bonded and coupled, a reference pressure cavity 101b' is formed at a position corresponding to the opening 101c', as shown in FIG. 9.

So far, a chip of the MEMS pressure sensor according to the present embodiment has been manufactured. An array of multiple MEMS pressure sensors is formed on the first substrate 100', and a conductor connecting array (not shown) corresponding to the multiple MEMS pressure sensors is formed on the second substrate 200'. Next, a dicing process is performed, and then the manufacturing process is switched from the silicon chip manufacturing process to a chip packaging process which is compatible with the chip packaging process of the IC and suitable for mass manufacturing so as to improve the productivity. For the packaging process, reference may be made to the description in the third embodiment.

Third Embodiment

Figure 13:
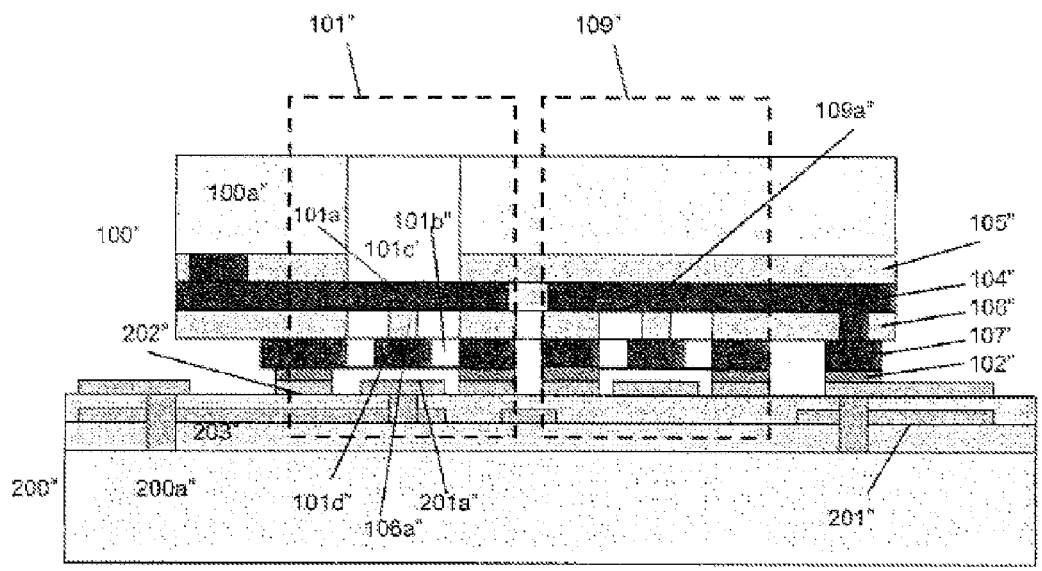
FIG. 13 is a schematic structural diagram of a MEMS pressure sensor according to a third embodiment.

FIG. 13 is a schematic structural diagram of the MEMS pressure sensor according to the present embodiment. As shown in this figure, a fixed electrode 201a" is disposed on the surface of a second substrate 200", a sensitive diaphragm 101a" and a movable electrode 101d" are provided on the surface of the first substrate 100". The position of the fixed electrode 201a" is corresponding to the position of the sensitive diaphragm 101a", and a reference pressure cavity 101b" is formed between the fixed electrode 201a" and the sensitive diaphragm 101a". The part of the first substrate 100" corresponding to the sensitive diaphragm 101a" is provided with an opening 101c" through which the sensitive diaphragm 101a" is exposed to the atmosphere, and the reference pressure cavity 101b" is sealed between the first substrate 100" and the second substrate 200".

The first substrate 100" sequentially includes: a silicon substrate 100a", a first dielectric layer 105" on the silicon substrate 100a", a second dielectric layer 106" on the first dielectric layer 105", a first conductor layer 104" embedded in the second dielectric layer 106" and a second conductor layer 107" on the second dielectric layer 106".

The second substrate 200" includes a SOI substrate or a monocrystalline silicon substrate 200a'. Preferably, a signal processing circuit (not shown) is provided in the second substrate 200". The signal processing circuit, e.g., a CMOS circuit, is disposed below the inter-conductor dielectric layer 203" and the conductor connecting 201", which is configured to receive, convert and detect an external pressure signal sensed by the capacitive pressure sensing unit 101". The conductor connecting layer 201" is configured to couple different devices and couple the second bonding layer 202" to the signal processing circuit in the second substrate 200".

The sensitive diaphragm 101a" is formed in the first conductor layer 104". The movable electrode 101d" is formed in the second conductor layer 107" and is coupled to the center of the sensitive diaphragm 101a" through a supporting arm 106a", and the fixed electrode 201a" is formed in the conductor connecting layer 201". The supporting arm 106a" is a part of the second conductor layer 107" or the second dielectric layer 106".

When the external pressure changes and thus the sensitive diaphragm 101a" is deformed in the direction perpendicular to the first substrate 100" and the second substrate 200", the movable electrode 101d" is moved accordingly and the distance between the movable electrode 101d" and the fixed electrode 201a" is changed, thus a difference in the capacitance of the capacitive pressure sensing unit 101" is induced and is output by the signal processing circuit. Since the supporting arm 106a" is coupled to the center of the sensitive diaphragm 101a", the movement of the movable electrode 101d" may reflect the maximum deformation of the sensitive diaphragm 101a" such that a better sensitivity and linearity may be obtained.

Other structures of the MEMS pressure sensor according to the present embodiment such as the first bonding layer, the second bonding layer, the wire-bonding pad area, the reference unit and the packaging structure are similar to that of the previous embodiments and thus the illustrations thereof are omitted. The capacitive pressure sensor in this embodiment is different from that of the second embodiment in that: in the second embodiment, one end of the supporting arm is coupled to the second conductor layer or the second dielectric layer outside the sensitive diaphragm 101a'. Therefore, the supporting arm will not move when the sensitive diaphragm 101a" is deformed, and the fixed electrode 201a' on the other end of the supporting arm will not move either. However, in this embodiment, since the supporting arm 106a" is directly coupled to the center of the sensitive diaphragm 101a", the supporting arm 106a" will move when the sensitive diaphragm 101a" is deformed, and the movable electrode 101d" on the other end of the supporting arm 106a" will move as well.

The manufacturing method for the capacitive pressure sensor in this embodiment is similar to that of the second embodiment, and one of the differences between them is that in the step of manufacturing the first substrate in this embodiment, the pattern of the mask plate used for forming the second dielectric layer and/or the second conductor layer by the photolithography is different from that of the second embodiment.

The first substrate 100" includes an array consisting of multiple MEMS pressure sensors, and the second substrate 200" includes a signal processing circuit array (not shown) corresponding to the multiple MEMS pressure sensors. A chip of the MEMS pressure sensor is obtained by dicing after the multiple MEMS pressure sensors and the signal processing circuit arrays are integrated, and the MEMS pressure sensor is formed by performing a chip packaging process.

Figure 14:
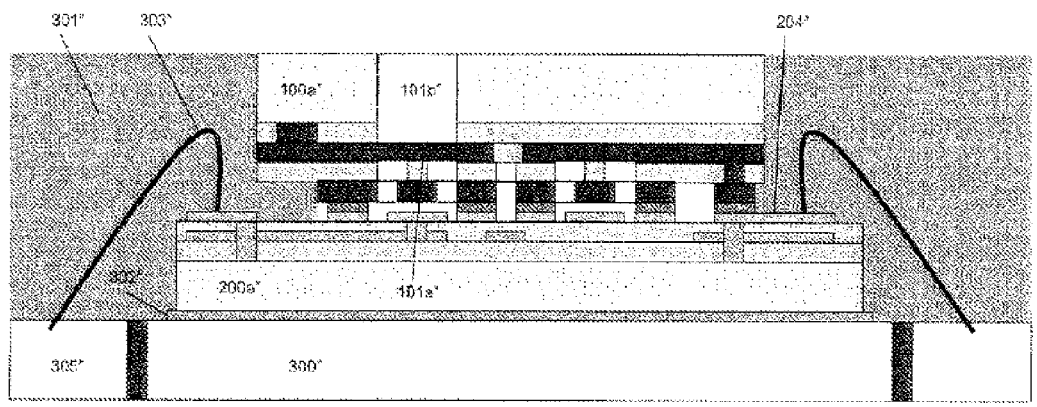
FIG. 14 is a schematic packaging structural diagram of a MEMS pressure sensor according to the third embodiment.

The packaging of the capacitive MEMS pressure sensor according to the present invention will be illustrated below in conjunction with the accompanying drawings. As shown in FIG. 14, the packaging includes the following steps:

Step S5: a packaging substrate 300" is provided, which is provided with multiple wire-bonding pins 305". The packaging substrate 300" may include a ceramic substrate or a lead frame, or a Printed Circuit Board (PCB).

Step S6: the surface of the second substrate 200" of the MEMS pressure sensor opposite to the first substrate 100" is coupled to the packaging substrate 300", for example, the second substrate 200" is coupled to the packaging substrate 300" by using an adhesive 302".

Step S7: the wire-bonding pads 204" on the second substrate 200" is electrically coupled to the corresponding wire-bonding pins 305" on the packaging substrate 300" via a lead 303". Specifically, the two ends of the lead 303" are respectively coupled to the wire-bonding pad 204" and the wire-bonding pin 305" by a wire-bonding process.

Step S8: the plastic molding process is performed on the MEMS pressure sensor after the lead is coupled. A space above the surface of the packaging substrate 300" outside the first substrate 100" and the second substrate 200" is filled with a plastic packaging body 301" which protects a functional area such as the pressure sensing unit 101" (and the signal processing circuit) and acts to fix the lead 303".

Furthermore, when the plastic molding process is performed, a mold fixture is adopted to prevent the plastic from entering into the opening 101c" on the sensitive diaphragm 101a". The top surface of the finally formed packaging body 301 may be flush with the back surface of the first substrate 100" (as shown in FIG. 7), or may protrude with respect to the back surface of the first substrate 100". In order to prevent the plastic from entering into the opening 101c", the opening 101c" is covered by the mold fixture during the packaging process.

After the packaging process is performed, as shown in FIG. 14, the MEMS pressure sensor further includes a packaging substrate 300" below the second substrate 200" and a packaging body 301" enclosing the first substrate 100" and the second substrate 200" above the packaging substrate 300". The adhesive 302" is further provided between the second substrate and the packaging substrate. Preferably, a stress buffer layer (not shown) is further provided between the packaging body 301", and the first substrate 100" and the second substrate 200" which are fixedly coupled to each other. The stress buffer layer is configured to buffer the stress of the packaging body 301" so as to reduce its interference on the sensitivity of the sensitive diaphragm.

Furthermore, when the plastic molding process is performed, a mold fixture is adopted to prevent the plastic from entering into the opening 101c" corresponding to the sensitive diaphragm 101a". The top surface of the finally formed packaging body 301" may be flush with the back surface of the first substrate 100" (as shown in FIG. 14), or may protrude with respect to the back surface of the first substrate 100". In order to prevent the plastic from entering into the open, the opening 101c" is covered by the mold fixture during the packaging process.

It is to be noted that the "enclosing" for the packaging body 301" enclosing the first substrate 100" and the second substrate 200" means enclosing the first substrate and the second substrate together. As shown in FIG. 14, the packaging body may encloses the first substrate and the second substrate from side surfaces of the first substrate and the second substrate, and may further cover the back surface of the first substrate. However the packaging body will not cover the opening on the back surface of the first substrate.

The second substrate of the MEMS pressure sensor according to the above embodiment includes at least one conductor connecting layer and one second bonding layer, and in practice, may only include one conductor connecting layer which is also used as the second bonding layer.

The "conductor" in the conductor connecting layer, the inter-conductor dielectric layer or the first conductor layer, or the second layer in embodiments of the present invention includes but not limited to materials of a metal, an alloy or a semiconductor.

Preferred embodiments of the present invention have been disclosed above, which should not be interpreted as limiting the present invention. Numerous possible alternations, modifications and equivalents can be made to the technical solution of the present invention by those skilled in the art based on the methods and technical contents disclosed herein without deviating from the technical scope of the present invention. Therefore, any simple alternations, modifications, and equivalents made to the above embodiments according to the technical essential of the present invention without deviating form the scope of the present invention should fall within the scope of protection of the present invention.

The invention claimed is:

1. A Micro Electromechanical System (MEMS) pressure sensor comprising:
   a first substrate provided with a sensitive diaphragm of a capacitive pressure sensing unit, an electrical connecting layer and a first bonding layer on a surface of the first substrate; and
   a second substrate provided with an inter-conductor dielectric layer, a conductor connecting layer in the inter-conductor dielectric layer and/or a second bonding layer on a surface of the second substrate;
   wherein the second substrate is arranged opposite to the first substrate, and the second substrate is fixedly coupled to the first substrate via the first bonding layer and the second bonding layer; a pattern of the first bonding layer is corresponding to a pattern of the second bonding layer, and both the first bonding layer and the second bonding layer are formed of a conductive material;
   wherein the capacitive pressure sensing unit comprises the sensitive diaphragm and a reference pressure cavity; the reference pressure cavity is disposed between the sensitive diaphragm and the second substrate and the reference pressure cavity is a single cavity surrounded by a wall, wherein the wall comprises at least one element selected from a group consisting of the first bonding layer and the second bonding layer.

2. The MEMS pressure sensor according to claim 1, wherein the back surface of the first substrate is provided with an opening through which the sensitive diaphragm is exposed to the atmosphere.

3. The MEMS pressure sensor according to claim 2, wherein the sensitive diaphragm is provided with a protective dielectric layer.

4. The MEMS pressure sensor according to claim 2, wherein a fixed electrode is on the surface of the second substrate and is disposed corresponding to the position of the sensitive diaphragm.

5. The MEMS pressure sensor according to claim 3, wherein the first substrate comprises a silicon substrate, a first dielectric layer on the silicon substrate, a second dielectric layer on the first dielectric layer, a first conductor layer embedded in the second dielectric layer and a second conductor layer on the second dielectric layer;
   the first bonding layer is disposed on the second conductor layer;
   the capacitive pressure sensing unit further comprises a movable electrode in the reference pressure cavity, which is formed in the second conductor layer and is coupled to the center of the sensitive diaphragm though a supporting arm;
   the sensitive diaphragm is formed in the first conductor layer.

6. The MEMS pressure sensor according to claim 2, wherein a fixed electrode is on the surface of the first substrate and is corresponding to the position of the sensitive diaphragm.

7. The MEMS pressure sensor according to claim 6, wherein the first substrate comprises a silicon substrate, a first dielectric layer on the silicon substrate, a second dielectric layer on the first dielectric layer, a first conductor layer embedded in the second dielectric layer and a second conductor layer on the second dielectric layer;
   the first bonding layer is on the second conductor layer;
   the sensitive diaphragm is formed in the first conductor layer;
   the fixed electrode is formed in the second conductor layer and is coupled to the part of the first conductor layer outside the sensitive diaphragm though a supporting arm.

8. The MEMS pressure sensor according to claim 7, wherein a part of the surface of the second substrate within the reference pressure cavity is provided with a self-test electrode which is disposed at a position corresponding to the sensitive diaphragm of the capacitive pressure sensing unit in the first substrate.

9. The MEMS pressure sensor according to claim 5, wherein the supporting arm is a part of the second conductor layer or the second dielectric layer.

10. The MEMS pressure sensor according to claim 1, wherein the second substrate comprises a SOI substrate or a monocrystalline silicon substrate, and a signal processing circuit is further provided in a part of the second substrate below the inter-conductor dielectric layer.

11. The MEMS pressure sensor according to claim 1, wherein the second substrate is further provided with a plurality of wire-bonding pads on the periphery of the conductor connecting layer, and a part of the first substrate corresponding to the plurality of wire-bonding pads is removed.

12. The MEMS pressure sensor according to claim 1, further comprising a reference unit which has the same structure as the capacitive pressure sensing unit.

13. The MEMS pressure sensor according to claim 1, further comprising:
   a packaging substrate which is below the second substrate and provided with a plurality of wire-bonding pins;
   a packaging body which is disposed above the packaging substrate and encloses the first substrate and the second substrate;
   an adhesive which is disposed between the second substrate and the packaging substrate; and
   a lead which is in the packaging body, two ends of the lead are respectively coupled to the wire-bonding pad and the wire-bonding pin.

14. A manufacturing method for a MEMS pressure sensor comprising:
   providing a first substrate, and forming, in the first substrate, a capacitive pressure sensing unit with a sensitive diaphragm, an electrical connecting layer and a first bonding layer on a surface of the first substrate;
   providing a second substrate, and forming, in the second substrate, an inter-conductor dielectric layer, a conductor connecting layer in the inter-conductor dielectric layer and/or a second bonding layer on a surface of the second substrate; and
   arranging the first bonding layer to be opposite to the second bonding layer, and bonding the first bonding layer to the second bonding layer according to a pattern correspondence so as to fixedly and electrically couple the first substrate to the second substrate, and to form, between the sensitive diaphragm and the second substrate, a reference pressure cavity, wherein the reference pressure cavity is a single cavity surrounded by a wall, and the wall comprises at least one element selected from a group consisting of the first bonding layer and the second bonding layer.

15. The manufacturing method for the MEMS pressure sensor according to claim 14, wherein the step of forming, in the first substrate, the capacitive pressure sensing unit, the electrical connecting layer and the bonding layer on the surface of the first substrate comprises:
   forming, in the first substrate, a first dielectric layer and a first conductor layer on the first dielectric layer; a through-hole and a connecting plug being provided in the first dielectric layer, and the sensitive diaphragm of the capacitive pressure sensing unit and the electrical connecting layer being provided in the first conductor layer;
   forming a first bonding material layer on the surface of the first substrate on which the sensitive diaphragm and the electrical connecting layer are provided; and
   etching the first bonding material layer by a photolithography process using a first mask plate so as to form the first bonding layer, a part of the first bonding material layer above the sensitive diaphragm being also removed.

16. The manufacturing method for the MEMS pressure sensor according to claim 14, wherein the step of forming, in the second substrate, the inter-conductor dielectric layer, the conductor connecting layer in the inter-conductor dielectric layer and/or the second bonding layer on a surface of the second substrate comprises:
   forming, in the second substrate, the inter-conductor dielectric layer and the conductor connecting layer in the inter-conductor dielectric layer;
   depositing a second bonding material layer on the conductor connecting layer, or the second bonding material layer being the uppermost conductor material layer of the conductor connecting layer; and
   etching the second bonding material layer by the photolithography process using a second mask plate so as to form the second bonding layer.

17. The manufacturing method for the MEMS pressure sensor according to claim 14, further comprising:
   forming a plurality of wire-bonding pads within a wire-bonding pad area on the periphery of the conductor connecting layer while forming the second bonding layer or the conductor connecting layer on the second substrate.

18. The manufacturing method for the MEMS pressure sensor according to claim 17, after or before fixedly and electrically coupling the first substrate to the second substrate, the manufacturing method further comprising:
   removing a part of the first substrate corresponding to the wire-bonding pad area to expose the plurality of wire-bonding pads at the wire-bonding pad area, and at the same time, removing a part of the first substrate above the sensitive diaphragm.

19. The manufacturing method for the MEMS pressure sensor according to claim 14, further comprising:
   forming a self-test electrode while forming the second bonding layer on the second substrate, or forming the self-test electrode while forming the conductor connecting layer in the second substrate, the position of the self-test electrode being corresponding to the sensitive diaphragm of the capacitive pressure sensing unit in the first substrate.

20. The manufacturing method for the MEMS pressure sensor according to claim 14, after fixedly and electrically coupling the first substrate to the second substrate, the manufacturing method further comprising:
   providing a packaging substrate on which a plurality of wire-bonding pins are provided;
   coupling a surface of the second substrate opposite to the first substrate to the packaging substrate;
   electrically coupling the wire-bonding pads of the second substrate to the corresponding wire-bonding pins on the packaging substrate via a lead; and
   performing a plastic molding process to fill a space above the surface of the packaging substrate, except for the first substrate and the second substrate, with a packaging body.

21. The MEMS pressure sensor according to claim 7, wherein the supporting arm is a part of the second conductor layer or the second dielectric layer.

* * * * *